(12) United States Patent
Hansen et al.

(10) Patent No.: US 10,411,443 B2
(45) Date of Patent: Sep. 10, 2019

(54) GAS FILLED SUBSEA ELECTRONICS HOUSING WITH SPRING ENGAGED HEAT SINK

(71) Applicant: ONESUBSEA IP UK LIMITED, London (GB)

(72) Inventors: Markus Leonard Hansen, Kvaløysletta (NO); Audun Magne Askeland, Bergen (NO)

(73) Assignee: ONESUBSEA IP UK LIMITED, London (GB)

( * ) Notice: Subject to any disclaimer, the term of this patent is extended or adjusted under 35 U.S.C. 154(b) by 0 days.

(21) Appl. No.: 15/798,279

(22) Filed: Oct. 30, 2017

(65) Prior Publication Data

US 2018/0123328 A1    May 3, 2018

Related U.S. Application Data

(63) Continuation of application No. 14/970,198, filed on Dec. 15, 2015, now Pat. No. 9,806,503.

(51) Int. Cl.
| | |
|---|---|
| H02B 1/56 | (2006.01) |
| H02B 1/28 | (2006.01) |
| H02B 1/46 | (2006.01) |
| H02B 3/00 | (2006.01) |
| H05K 7/20 | (2006.01) |

(52) U.S. Cl.
CPC .............. *H02B 1/565* (2013.01); *H02B 1/28* (2013.01); *H02B 1/46* (2013.01); *H02B 3/00* (2013.01); *H05K 7/209* (2013.01); *H05K 7/20936* (2013.01)

(58) Field of Classification Search
None
See application file for complete search history.

(56) References Cited

U.S. PATENT DOCUMENTS

| | | | |
|---|---|---|---|
| 4,528,615 A | 7/1985 | Perry | |
| 5,218,517 A | 6/1993 | Sewell | |
| 6,735,086 B1 | 5/2004 | Weber et al. | |
| 7,545,639 B2 * | 6/2009 | Ridge | ........... G11B 23/021 |
| | | | 109/75 |
| 2004/0240184 A1 * | 12/2004 | Rivera | ........... H01L 23/427 |
| | | | 361/720 |

(Continued)

FOREIGN PATENT DOCUMENTS

| | | |
|---|---|---|
| EP | 2931012 A1 | 10/2015 |
| WO | 01/13692 A1 | 2/2001 |
| WO | 2012046125 A1 | 4/2012 |

OTHER PUBLICATIONS

PCT International Search Report & Written Opinion for PCT Application No. PCT/EP2016/080520 dated Mar. 24, 2017; 14 Pages.

*Primary Examiner* — Courtney L Smith
(74) *Attorney, Agent, or Firm* — Fletcher Yoder, P.C.

(57) ABSTRACT

Heat sinks that cool electronics are mounted within a subsea housing or vessel. Springs are used to provide pressure between the heat sinks and a vessel wall. Vessel wall deformation caused by external seawater pressure is absorbed by the springs, which maintain a pre-load force according to the spring characteristics. The mechanism also allows for rack mounting of the electronics without the need for manual access in the relatively compact vessel or housing.

19 Claims, 14 Drawing Sheets

(56) References Cited

U.S. PATENT DOCUMENTS

| | | | |
|---|---|---|---|
| 2007/0146996 A1* | 6/2007 | Herring | H01L 23/427 361/700 |
| 2009/0071632 A1* | 3/2009 | Bryant | F28D 15/0241 165/104.26 |
| 2009/0097207 A1 | 4/2009 | Gough | |
| 2014/0133272 A1 | 5/2014 | Sallas et al. | |
| 2014/0138059 A1* | 5/2014 | Ambrose | B64G 1/503 165/104.26 |
| 2016/0010619 A1 | 1/2016 | Phillips | |
| 2016/0061382 A1* | 3/2016 | Simpkins | F25D 19/006 62/51.1 |
| 2016/0088778 A1* | 3/2016 | Geisler | H05K 7/20927 361/699 |
| 2016/0126046 A1* | 5/2016 | Aarskog | H01H 85/0021 337/205 |
| 2017/0055358 A1* | 2/2017 | Aarskog | H05K 7/1432 |
| 2017/0170640 A1* | 6/2017 | Hansen | H02B 1/28 |

* cited by examiner

GAS FILLED SUBSEA ELECTRONICS HOUSING WITH SPRING ENGAGED HEAT SINK

CROSS-REFERENCE TO RELATED APPLICATION

This application is a continuation of U.S. application Ser. No. 14/970,198, entitled "Gas Filled Subsea Electronics Housing with Spring Engaged Heat Sink," filed Dec. 15, 2015, which is hereby incorporated by reference in its entirety for all purposes.

TECHNICAL FIELD

The present disclosure relates to placing electronics in subsea locations. More particularly, the present disclosure relates to subsea gas filled electronics housings having heat sinks for cooling the electronics.

BACKGROUND

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In some cases, it is desirable to place electronics in subsea locations, such as for projects involving the recovery of oil and gas from subsea reservoirs. The electronics can be placed in an oil filled housing which has some advantages but often suffers from additional qualification procedures for the electronic components. An alternative is to place the electronics in a gas filled subsea housing that can maintain the electronics at atmospheric pressure. Some types of electronics inherently create relatively large amounts of heat that must be dissipated. Examples of such heat generating electronics include subsea power electronics, such as those components used for controlling and providing variable frequency electric power to subsea and downhole equipment such as pumps and compressors.

An alternative to placing such electronics subsea is to locate the variable frequency power converters, or variable speed drives (VSDs), in a surface facility such as on a platform or a vessel such as a floating production storage and offloading vessel (FPSO). However, in cases where independent control of multiple pumps and/or compressors with topside VSDs is desirable, each pump and compressor will need to have its own dedicated conductors, which usually amount to three electrical conductors for each pump and compressor running all the way to the platform or FPSO.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

According to some embodiments, a subsea electronics housing is described that includes: a gas-filled internal volume partially defined by a housing wall; heat generating electronics modules positioned within the volume; heat sinks in thermal communication with the electronics modules; spring mechanisms arranged and configured, when engaged, to apply force against the heat sinks to hold them in thermal communication with the housing wall; and a spring engagement mechanism configured to selectively engage the spring mechanisms thereby causing them to apply force against the heat sinks and to selectively disengage the spring mechanisms thereby causing it to reduce force against the heat sinks.

According to some embodiments, the spring engagement mechanism can be initiated using an initiation force that is not in the same direction as the force being applied against the heat sinks. For example, the initiation force can be applied to a central shaft in a direction parallel to the shaft (i.e. axial), while the direction the force applied to the heat sinks by the spring mechanisms is radial. The initiation force can be converted to the force applied to the heat sinks using one or more pivots. The spring mechanisms can be mechanical springs or some other type of springs such as hydraulic springs. A heat conducting filler material can be disposed between the heat sinks and the housing wall, thereby enhancing thermal communication between heat sinks and the housing wall when pressed together.

According to some embodiments, the electronics modules can be mounted directly to the heat sinks, or they can be separated, for example using heat pipes. According to some embodiments, the electronics modules can include power electronics, such as used for driving a plurality of subsea variable speed electric motors for pumps and/or compressors. The housing wall can be configured to withstand external subsea pressures while maintaining an atmospheric pressure inside the volume.

According to some embodiments, a method is described for deploying electronics in a subsea location. The method includes: on the surface, placing heat sinks and heat generating electronics modules within a subsea electronics housing; sealing the subsea electronics housing while on the surface thereby forming a gas-filled internal volume partially defined by a housing wall; engaging spring mechanisms so as to apply force that holds the heat sinks in thermal communication with the housing wall; and deploying the sealed electronics housing to a subsea location while maintaining the electronics in a gas filled environment.

As used herein the terms "atmospheric" and "atmospheric pressure" refer to pressures at or near, one bar, or the pressure exerted by the weight of air in the atmosphere of the surface of the Earth. The terms are approximate only and are not intended to specify that the pressure is precisely one bar. As used herein the term "variable" and "adjustable" are used interchangeably, and so the terms "variable speed drive" and "adjustable speed drive" are also used interchangeably.

BRIEF DESCRIPTION OF THE DRAWINGS

The subject disclosure is further described in the detailed description which follows, in reference to the noted plurality of drawings by way of non-limiting examples of embodiments of the subject disclosure, in which like reference numerals represent similar parts throughout the several views of the drawings, and wherein.

DETAILED DESCRIPTION

The particulars shown herein are by way of example, and for purposes of illustrative discussion of the embodiments of the subject disclosure only and are presented in the cause of providing what is believed to be the most useful and readily understood description of the principles and conceptual aspects of the subject disclosure. In this regard, no attempt is made to show structural details of the subject disclosure in more detail than is necessary for the fundamental understanding of the subject disclosure, the description taken with the drawings making apparent to those skilled in the art how the several forms of the subject disclosure may be embodied in practice. Further, like reference numbers and designations in the various drawings indicate like elements.

When placing heat-generating electronics in an atmospheric pressure gas-filled subsea housing, one or more heat sinks can be used. Adequate thermal contact between the heat sinks and the housing wall should be maintained for good cooling. The heat sinks can be bolted or screwed into to the housing wall to increase heat dissipation into the surrounding seawater. However, the holes in the housing used with bolts, screws or other fasteners that rely on holes weaken the housing material. The housing may need to be made thicker to compensate. The thicker housing further insulates the heat sink from the seawater. Furthermore, it has been found that when bolting the heat sinks to the housing wall it is difficult to maintain a good contact even when using a thermal filler material due to the shape deformation of the housing that occurs at various deployment depths. Finally, it has been found that allowing space for bolt-tightening tools inside the housing while installing the electronics modules and heat sinks can be difficult. Additional space for tool access within the housing leads to a larger volume housing which can lead to thicker walls and poorer cooling.

According to some embodiments, techniques for mounting heat sinks that cool electronics in a subsea housing or vessel are described. A mechanism is used to transfer vertical force to horizontal force. Springs are used to provide horizontal pressure between the heat sinks and a vessel wall. Vessel wall deformation caused by external seawater pressure is absorbed by the springs, which maintain a pre-load force according to the spring characteristics. The mechanism also allows for rack mounting of the electronics without the need for manual access in the relatively compact vessel or housing.

Figure 1:
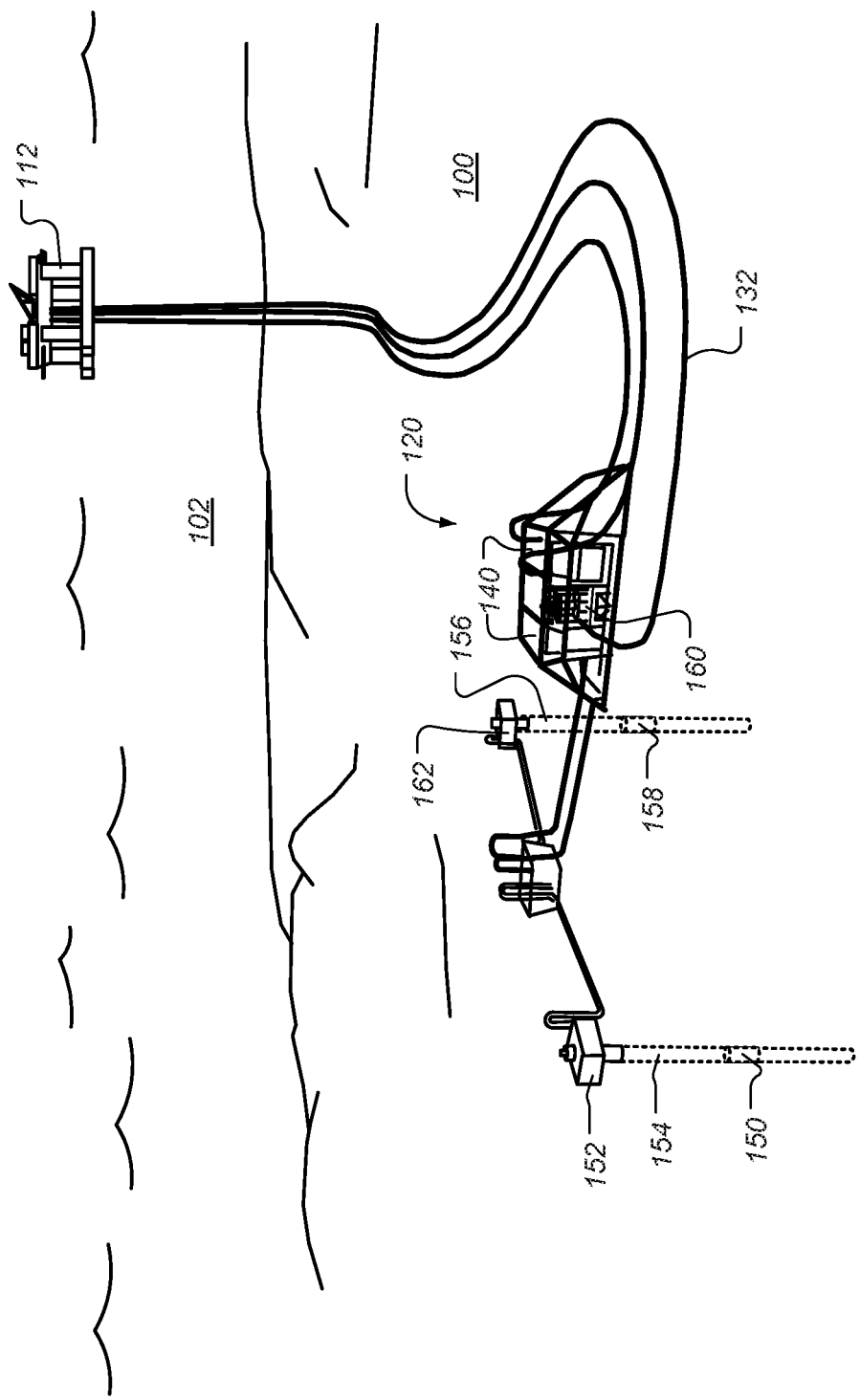
FIG. 1 is a diagram illustrating a subsea environment in which gas-filled electronics housing can be deployed, according to some embodiments.

FIG. 1 is a diagram illustrating a subsea environment in which gas-filled electronics housing can be deployed, according to some embodiments. On sea floor 100 a subsea station 120 is shown which is downstream of several well-heads being used, for example, to produce hydrocarbon-bearing fluid from a subterranean rock formation. Station 120 includes one or more subsea fluid processing modules 140, which are powered by one or more electric motors, such as induction motors or permanent magnet motors. According to some embodiments, fluid processing modules 140 can be pumps, compressors and or separators. The station 120 is connected to one or more umbilical cables, such as umbilical 132. The umbilicals in this case are being run from a platform 112 through seawater 102, along sea floor 100 and to station 120. In other cases, the umbilicals may be run from some other surface facility such as a floating production, storage and offloading unit (FPSO), or a shore-based facility. The umbilical 132 is also used to supply electrical power to station 120. The umbilical 132 can also be used to supply fluids to and from station 120 as well as include control and data lines for use with the subsea equipment in station 120. Station 120 also includes a gas-filled electronics housing 160. The electronics within the subsea housing 160 can be used, for example, to provide variable speed drive power to each of several subsea electric motors using electrical power supplied through umbilical 132. The electric motors, for example can be used to drive the fluid processing machinery within station 120 or elsewhere in the subsea environment. Placing the variable frequency power converters in the subsea location can provide significant advantages such as reducing the number of separate electrical conductors running between the station 120 and the surface platform 112. According to some embodiments, the variable frequency generators within electronics housing 160 can be used to drive electrical submersible pumps (ESP) 150 and 158 shown installed within wells 154 and 156. Note that the ESPs 150 and 158 can either be located downhole, as shown wellbores 154 and 156 in FIG. 1, or they can be located in a subsea location such as on the sea floor in a Christmas tree at wellheads 152 and 162.

Figure 2A:
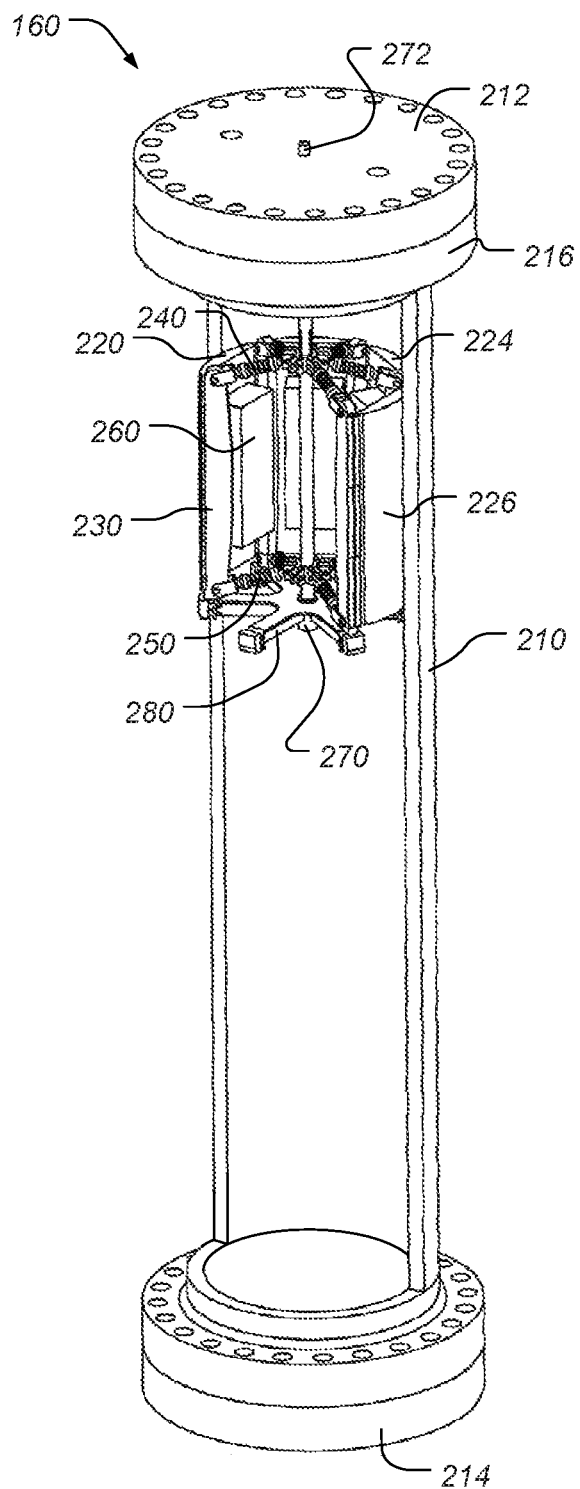
FIGS. 2A and 2B are diagrams illustrating some aspects of a gas-filled subsea electronics housing, according to some embodiments.
Figure 2B:
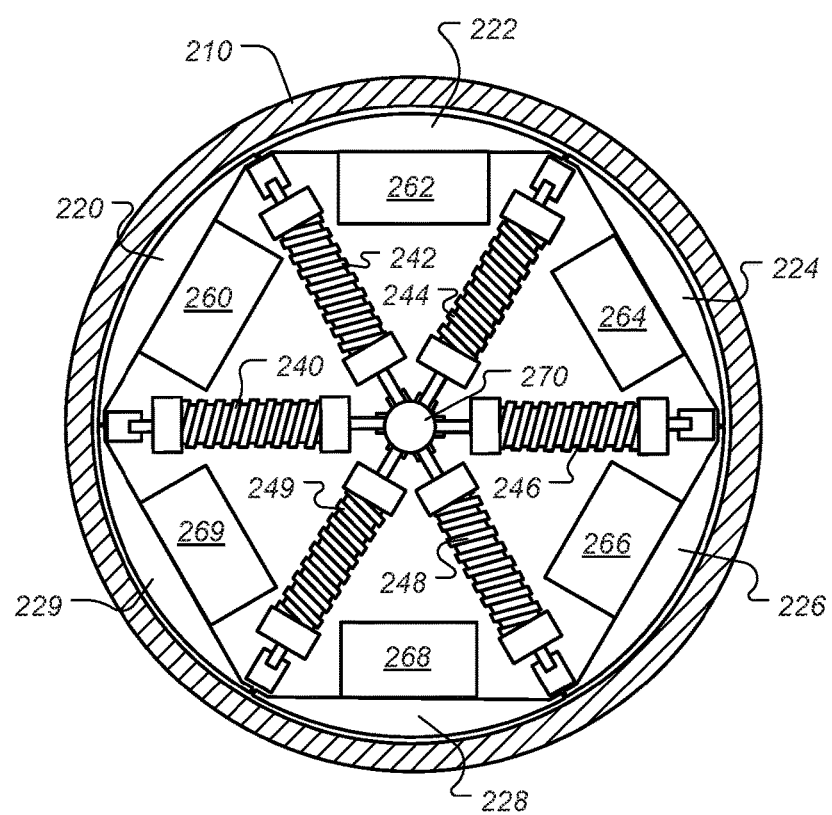

FIGS. 2A and 2B are diagrams illustrating some aspects of a gas-filled subsea electronics housing, according to some embodiments. Housing 160 includes a cylindrical housing wall 210 with bottom 214 and top 212. The flange members can be provided between the wall 210 and top and bottom, such as upper flange 216. The housing 160 is dimensioned to withstand external pressures associated with the deepest expected deployment depth while maintaining the inner volume of housing 160 at atmospheric pressure. The housing can be filled with air, although it is common to fill the housing with an inert gas such as nitrogen. Within the housing, several electronics modules such as module 260 are housed. Maintaining the subsea electronics at atmospheric pressure allows for several advantages over other types of housings, such as oil-filled subsea electronics housings. The advantages include far greater selection of electronics components as well as greatly simplified qualification process for each component. Some types of subsea electronics inherently create relatively large amounts of heat that must be dissipated. Examples of such heat generating electronics include subsea power electronics, such as those components used for controlling and providing variable frequency electric power to subsea and downhole equipment such as pumps and compressors. Accordingly a number of electronics heat sinks are provided (of which 220, 224 and 226 are clearly visible in FIG. 2A). The electronics modules are mounted in good thermal contact with the heat sinks. The heat sinks, in turn, are held in good thermal contact with the inner surface of the housing wall 210 using a number of springs. Springs are preferred for maintaining thermal contact between the heat sinks and the housing wall over other fastening techniques for a number of reasons. First, the housing wall 210 deforms to various shapes depending on the deployment depth. Spring-based mechanisms allow for greater flexibility than fixed fastener techniques such as screws or bolts when accommodating the various deformations encountered. Fasteners that rely on holes in the housing wall 210 inherently weaken the wall. A thicker wall material may be required which inhibits cooling from the surrounding seawater. Furthermore, the spring arrangements, such as described herein, can provide for tool-free and hand-free installation. This allows for a much more compact housing design, which also allows for thinner, and therefore less insulating, wall material. The spring clamping mechanism is configured such that a vertical (axial) force on the central shaft 270, for example, by turning a threaded nut 272 is translated into outward radial force on the springs (such as springs 240 and 250). A lower support structure 280 provides a stop to prevent the whole assembly from shifting too far downwards. FIG. 2B is a top view prior to spring engagement. In this example there are six electronic modules 260, 262, 264, 266, 268 and 269 that are thermally mounted on six heat sinks 220, 222, 224, 226, 228 and 229, respectively. Axial force in the downwards direction on shaft 270, by turning nut 272, is translated into the upper springs 240, 242, 244, 246, 248 and 249 which push on the edge tabs of the heat sinks such that they are forced into contact with the inner surface of the housing wall 210. Note that there are also six lower springs that are not visible in FIG. 2B.

Figure 3:
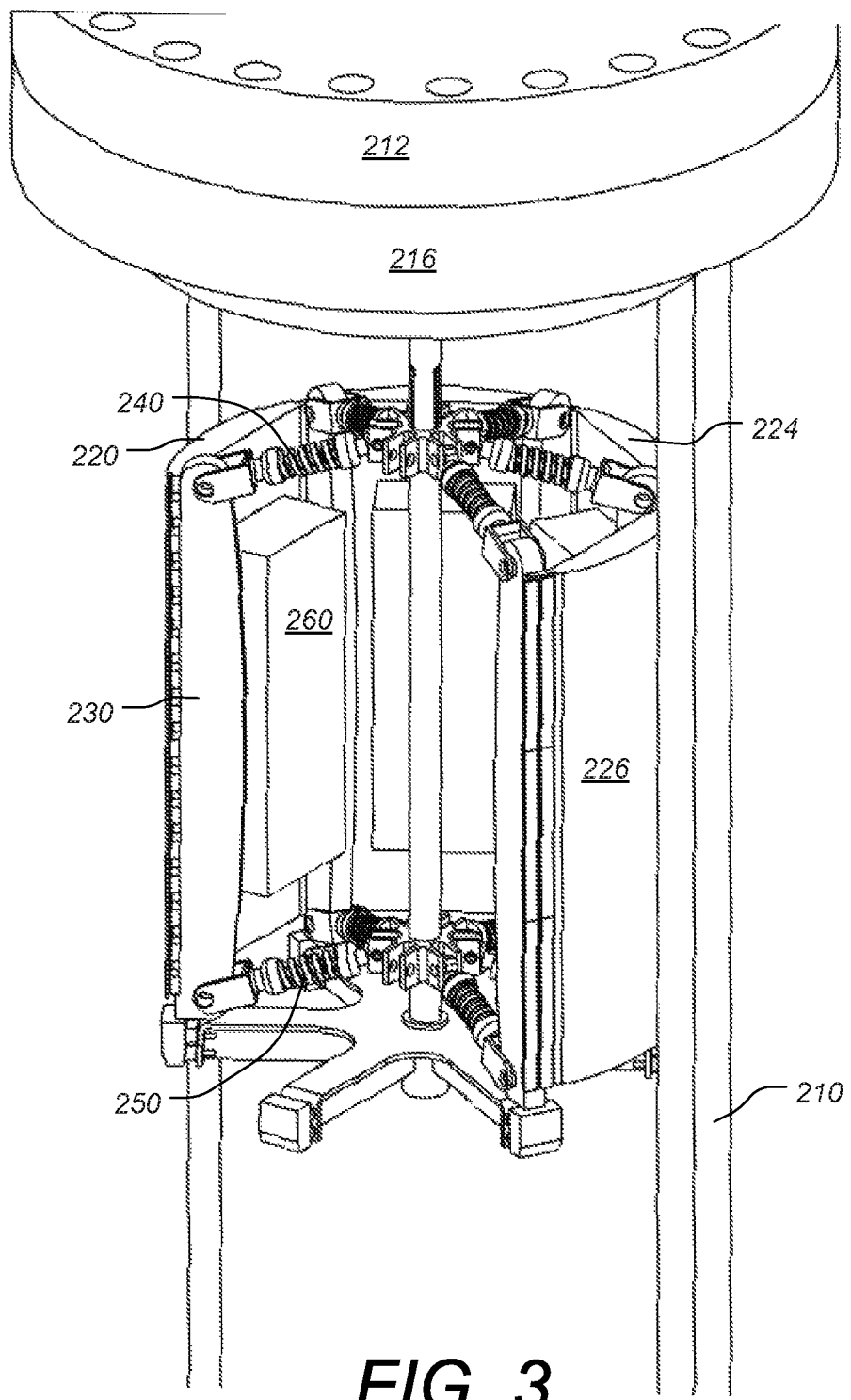
FIG. 3 is a diagram illustrating further detail of a gas-filled subsea electronics housing, according to some embodiments.

By turning nut 272, each of the springs are selectively engaged to push the heat sinks against the housing wall. When nut 272 is turned in the opposite direction, the shaft 270 moves upwards and each of the springs are selectively disengaged which reduces force on the heat sinks against the housing wall. By disengaging the springs, the electronics modules can be more easily removed from the housing such as for servicing and/or replacement. Note also that the selective engaging and disengaging of the springs, in this case using shaft 270 and nut 272, can be performed remotely, that is, from the outside of the electronics housing. FIG. 3 is a diagram illustrating further detail of a gas-filled subsea electronics housing, according to some embodiments. Note that although the springs, such as springs 240, 242, 244, 246, 248, 249, 250 and 256 are shown in the figures as coil-type springs, according to some embodiments other types of springs can be used including other shapes (e.g. flat or machined) and other types of material (e.g. gas or elastomer).

Figure 4A:
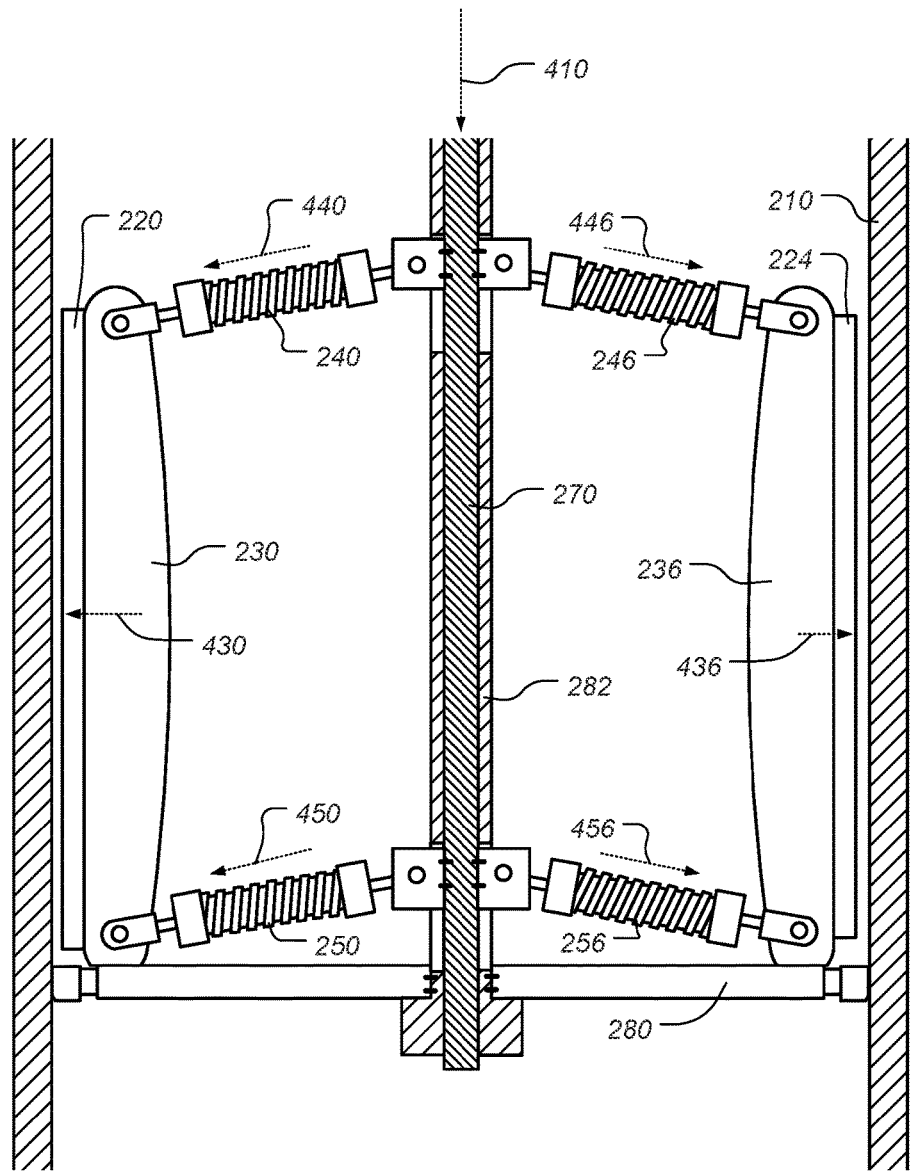
FIGS. 4A and 4B are diagrams illustrating further detail of the operation of a gas-filled subsea electronics housing, according to some embodiments.
Figure 4B:
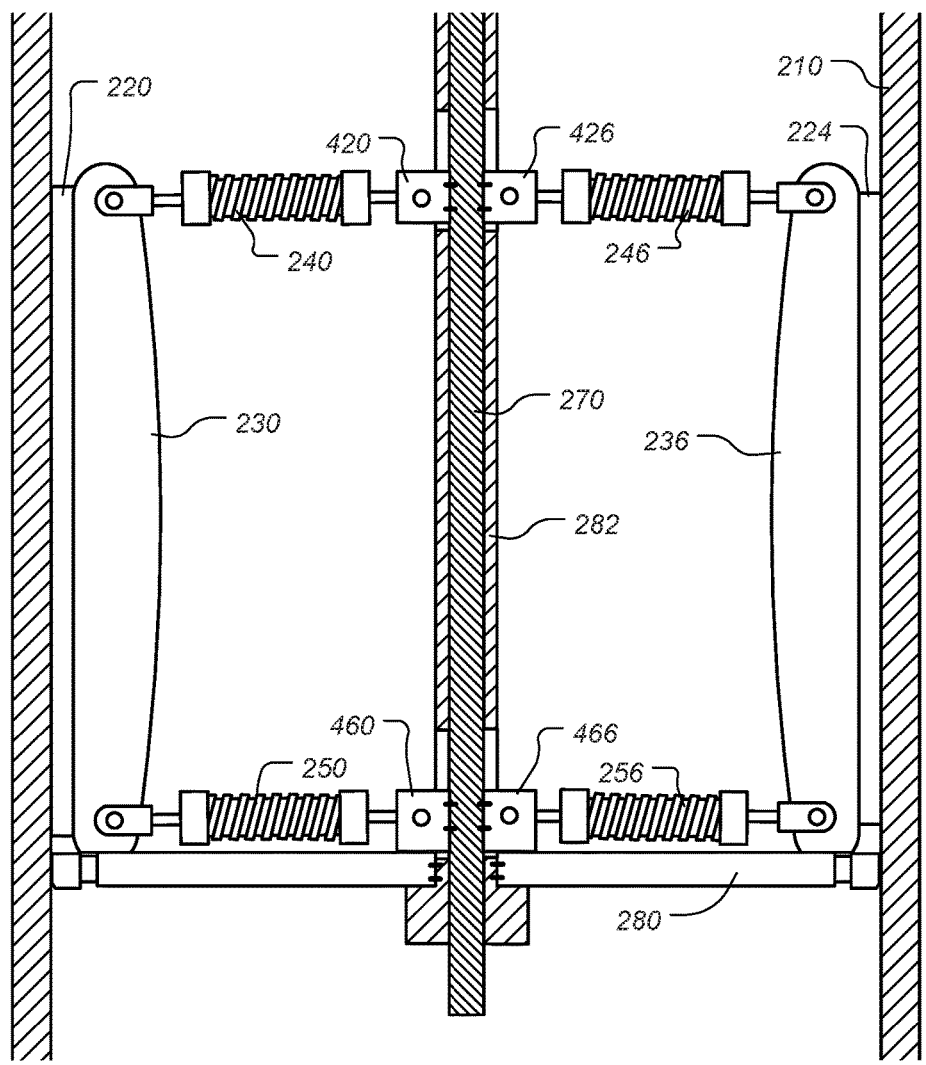

FIGS. 4A and 4B are diagrams illustrating further detail of the operation of a gas-filled subsea electronics housing, according to some embodiments. FIGS. 4A and 4B show the initial and final positions respectively of the shaft, springs, bars and heat sinks. Lower support 280 is braced against the inner surface of wall 210 and therefore remains stationary with respect to housing wall 210. The shaft 270 can slide in an axial direction within an outer sleeve 282 that is fixed to lower support 280. Axial force imparted on shaft 270, for example from turning an upper nut (not shown) causes shaft 270 to translate downwards as shown by arrow 410 in FIG. 4A. The downward axial force on shaft 270 is converted to the radial direction in upper springs 240, 246, 250 and 256 as shown by arrows 440, 446, 450 and 456 respectively. Note that the outer sleeve 282 has slots that allow the pivot members 420, 426, 460 and 466 to move axially, as shown in FIG. 4B. The springs push on bars 230 and 236 as shown by arrows 430 and 436 respectively. The bars 230 and 236 push radially outwards on the heat sinks (of which 220 and 224 are visible) to as to engage the inner surface of wall 210. Note that the bars 230 and 236 rest on support 280 as shown. FIG. 4B shows the springs, bars and heat sinks in full engagement with wall 210. As can be seen, the lower pivots 460 and 466 stop when resting on support 280 when in the position shown.

Figure 5:
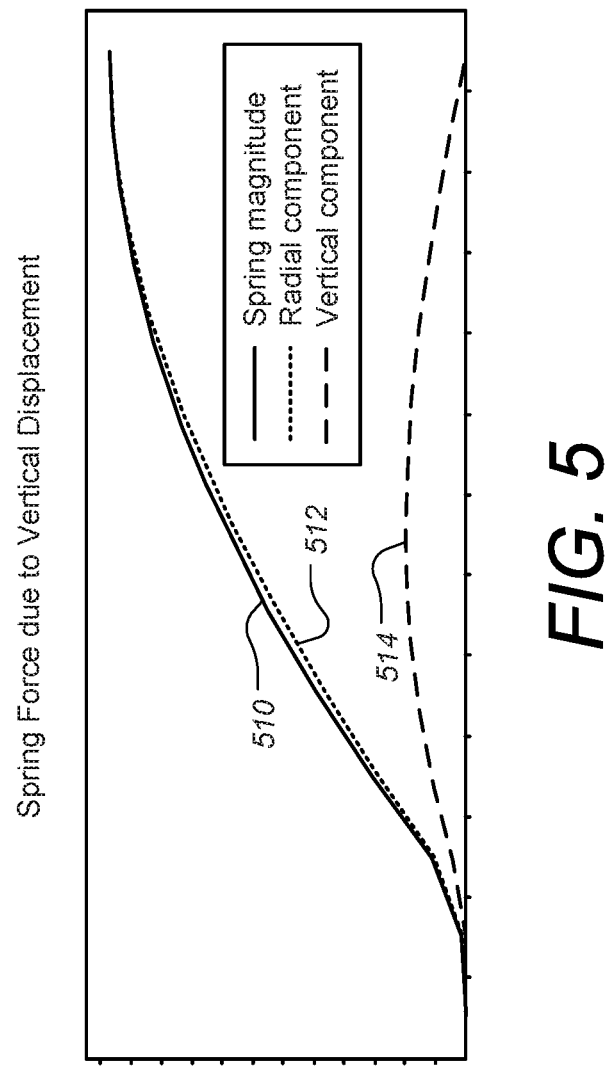
FIG. 5 is a graph that shows spring force due to vertical displacement of the central shaft, according to embodiments shown in FIGS. 2A, 2B, 3, 4A and 4B.

FIG. 5 is a graph that shows spring force due to vertical displacement of the central shaft, according to embodiments shown in FIGS. 2A, 2B, 3, 4A and 4B. Curves 510, 512 and 514 show spring magnitude, radial component and vertical component, respectively. When the central shaft pushes on the pivots and springs, this forces the spring to compress. The springs apply an increasingly larger force to the heat sinks as they reach the final position (as shown in FIG. 4B). As can be seen from curve 514, in the final horizontal position, all vertical force components reduce back to zero. Therefore, in the final position, no vertical (axial) force is exerted on the central shaft and top nut.

According to some embodiments, the spring force of the springs is selected so that the desired contact pressure is achieved between the heat sinks and vessel wall. According to some embodiments, depending on what kind of subsea operational conditions the enclosure is operating under, a filler material between the heat sinks and housing wall can be used. The filler material's purpose is to absorb tolerance differences between housing wall and the heat sinks and also to absorb deformations due to external pressure in the subsea conditions. According to some embodiments, the filler material can be elastomers with fillers, grease, phase change pads, liquid compounds, or gels. Absorbing deformation is an important consideration since that excessive strain could affect the electronics mounted on the heat sinks, and the deformation could disrupt a sufficient and reliable thermal connection between the heat sinks and the housing wall.

According to some embodiments, the described mounting methods allow for placing multiple electronic modules in racks that can be mounted in small diameter vessels or enclosure without the need for access by hands or tools. All of the electric equipment can be interconnected prior to placement in the housing. After interconnections are made, the electronics modules can be lowered inside the housing and then secured as described above.

Figure 6:
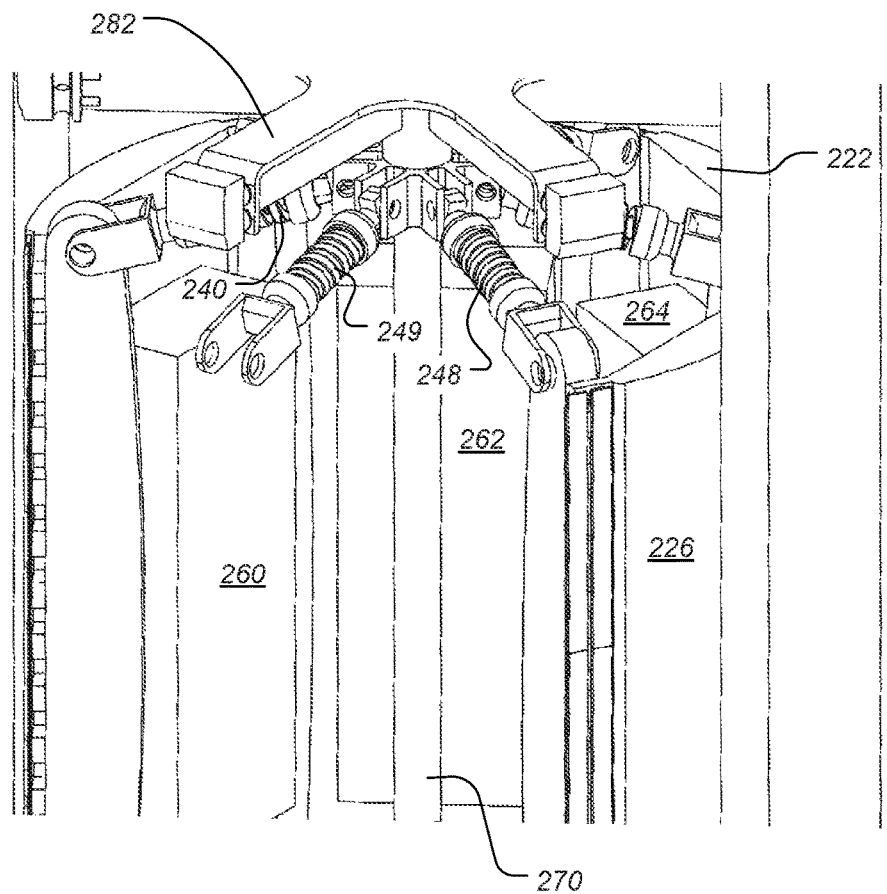
FIG. 6 shows further details associated with the embodiments FIGS. 2A, 2B, 3, 4A and 4B.

FIG. 6 shows further details associated with the embodiments FIGS. 2A, 2B, 3, 4A and 4B. In FIG. 6, an upper support 282 is visible that is useful in further stabilizing the internal components.

Figure 7:
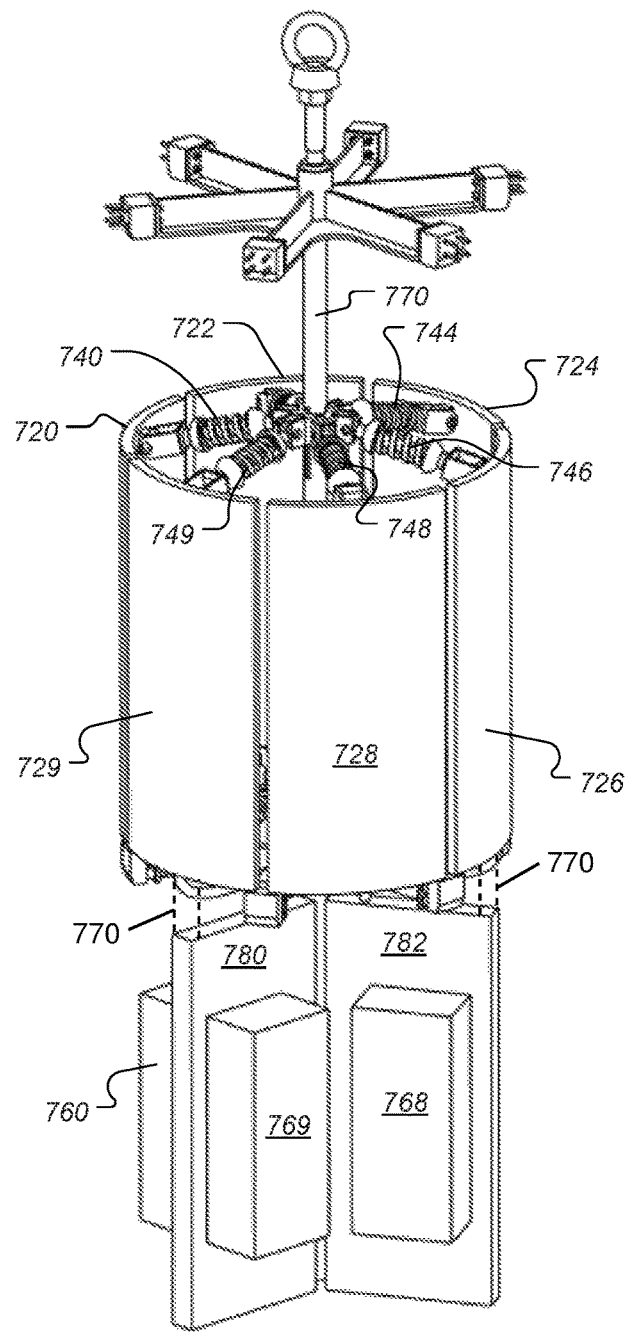
FIG. 7 is a diagram illustrating some aspects of a gas-filled subsea electronics housing, according to some other embodiments.

FIG. 7 is a diagram illustrating some aspects of a gas-filled subsea electronics housing, according to some other embodiments. In the example shown, rather than mounting the electronics modules directly to the heat sinks as shown in FIGS. 2A, 2B, 3, 4A, 4B and 6, one or more heat pipes 770 are used. Electronics modules such as modules 760, 768 and 769 are mounted to thermally conducting plates 780 and 782. The plates are cooled by heat pipes 770, which run vertically up to the heat sinks 720, 722, 724, 726, 728 and 729. The heat sinks can be pressed on the interior wall of the vessel housing using the same mechanisms as described above. In some cases, the diameter of the housing could be made smaller, or more room for electronics can be provided using a heat pipe 770 arrangement such as shown. According to some embodiments, the vertical separation of the electronics modules and the heat sinks such as shown in FIG. 7 can be used with any of the other embodiments described herein including with FIGS. 8A-B, 9A-B, 10A-B, 11 and 12 which are described infra.

Figure 8A:
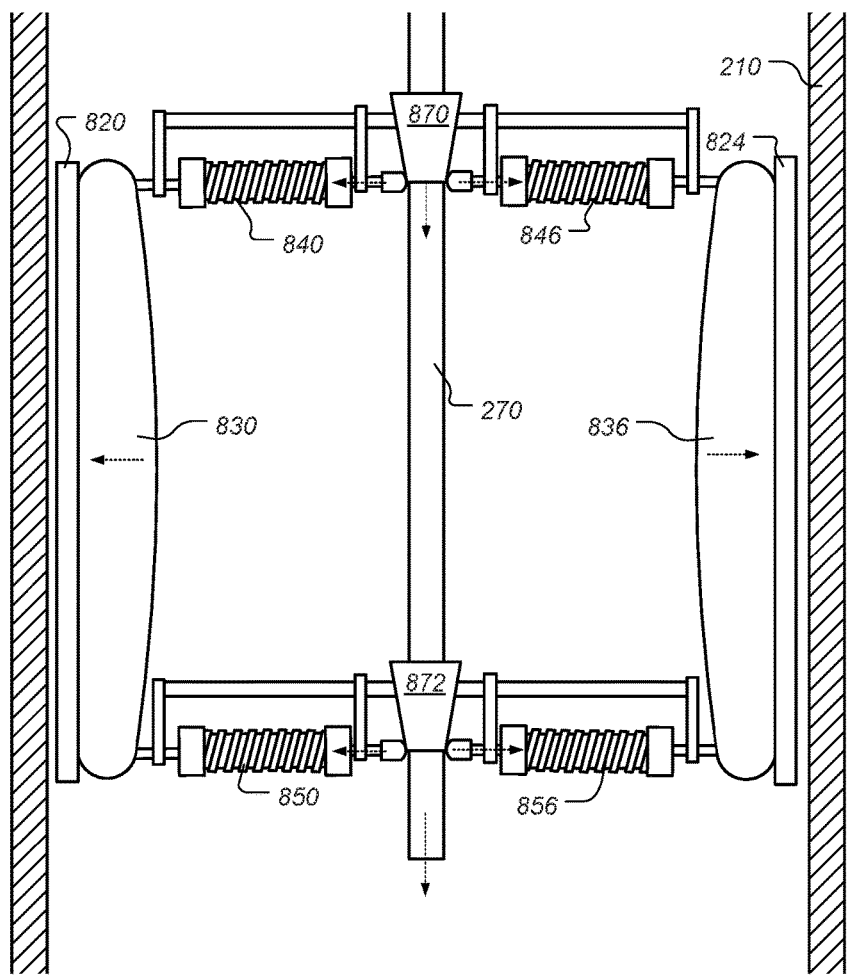
FIGS. 8A and 8B are diagrams illustrating some aspects of a gas-filled subsea electronics, according to some other embodiments.
Figure 8B:
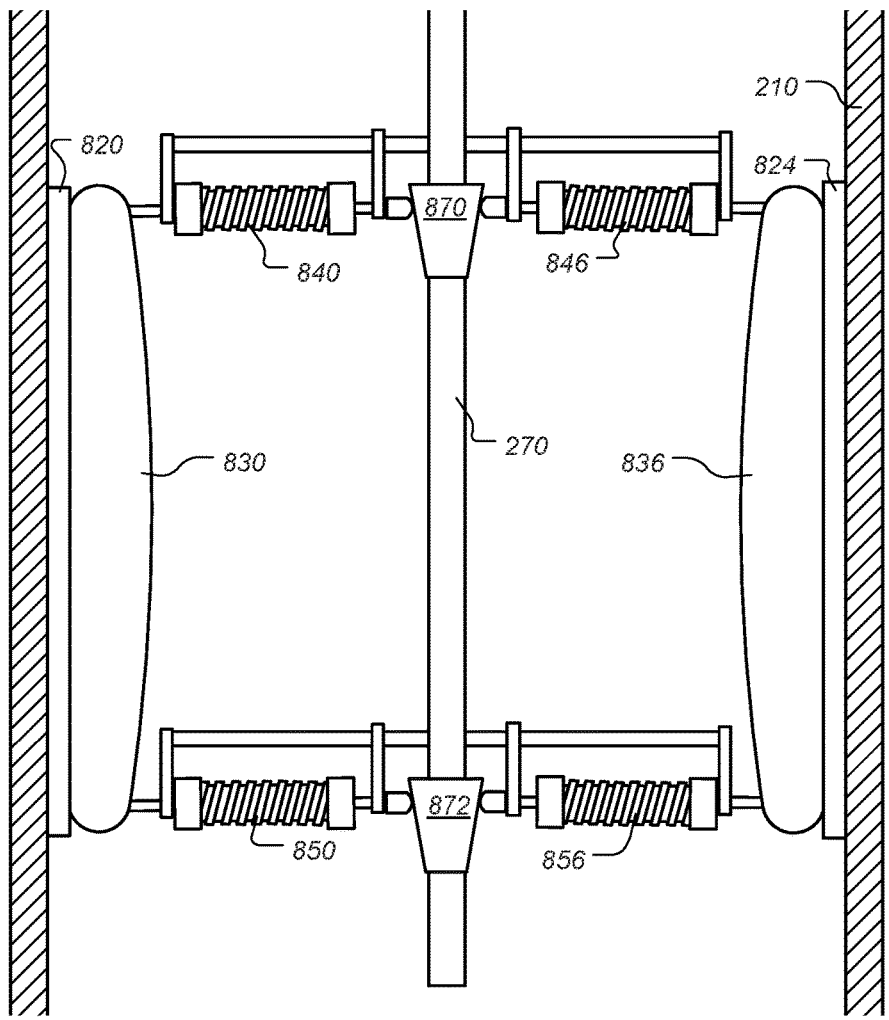

FIGS. 8A and 8B are diagrams illustrating some aspects of a gas-filled subsea electronics, according to some other embodiments. In the example shown, tapered, cone-shaped members 870 and 872 are used instead of pivots to convert the axial force on shaft 270 into radial force on the springs 840, 846, 850 and 856. The springs are engaged by applying downward motion of shaft 270 and are disengaged by moving the shaft 270 upwards (e.g. using a nut such as 272 shown in FIG. 2A). When compressed, or selectively engaged using the downward motion of the shaft 270, as shown in FIG. 8B, the bars 830 and 836 press on heat sinks 820 and 824 to full thermal engagement with housing wall 210.

Figure 9A:
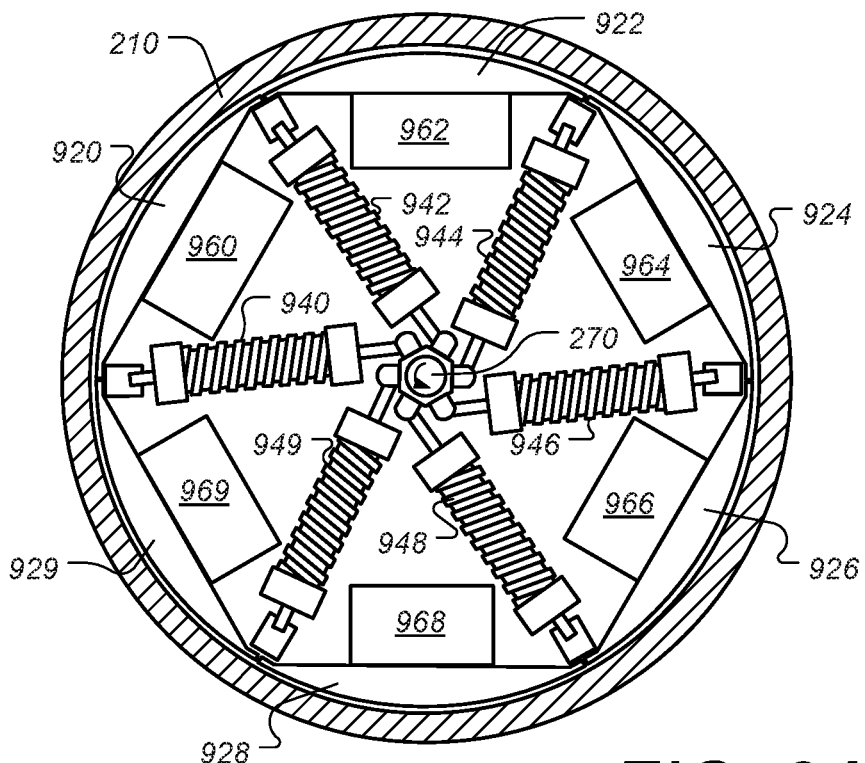
FIGS. 9A and 9B are diagrams illustrating some aspects of a gas-filled subsea electronics, according to some other embodiments.
Figure 9B:
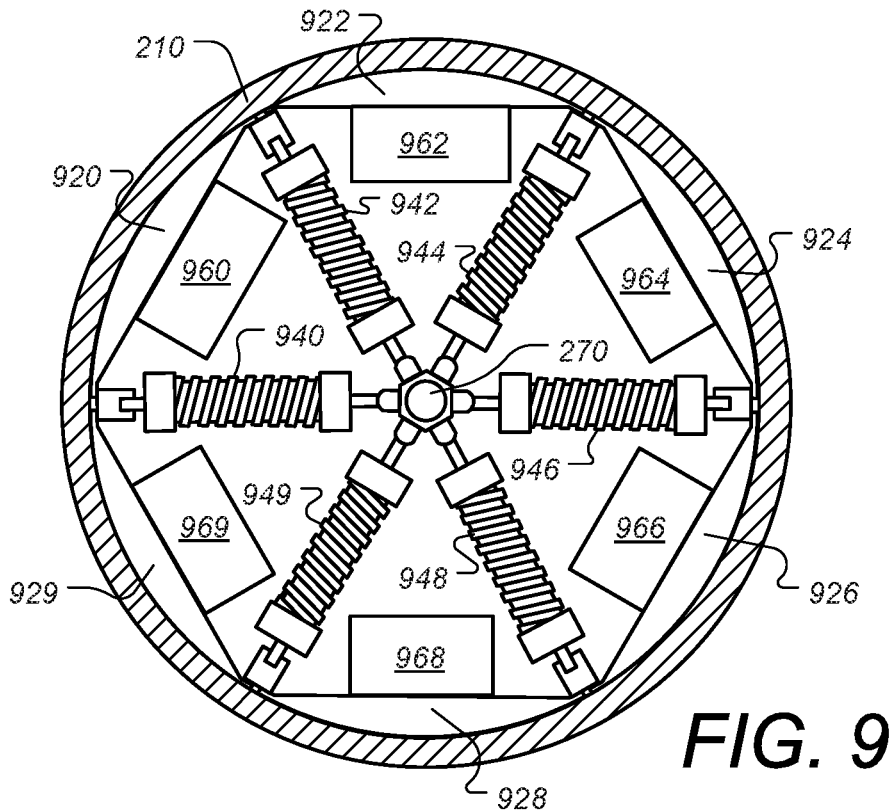

FIGS. 9A and 9B are diagrams illustrating some aspects of a gas-filled subsea electronics, according to some other embodiments. In this example, instead of axial force, a rotational force is applied to central shaft 270. FIG. 9A shows the initial position that allows installation of the electronics into the housing and FIG. 9B shows the final position with the heat sinks pressed against the housing wall. The rotational force in shaft 270 is converted via pivots, into the springs 940, 942, 944, 946, 948 and 949. As in the embodiments described above, the springs push on bars that press heat sinks 920, 922, 924, 926, 928 and 929 against housing wall 210. The electronics modules 960, 962, 964, 966, 968 and 969 are shown mounted directly on the heat sinks. Thus, in FIGS. 9A and 9B, the springs are selectively engaged and disengaged by rotating the shaft 270.

Figure 10A:
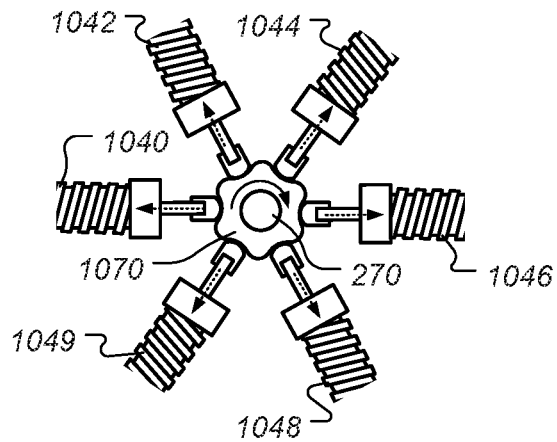
FIGS. 10A and 10B are diagrams illustrating some aspects of a gas-filled subsea electronics, according to some other embodiments.
Figure 10B:
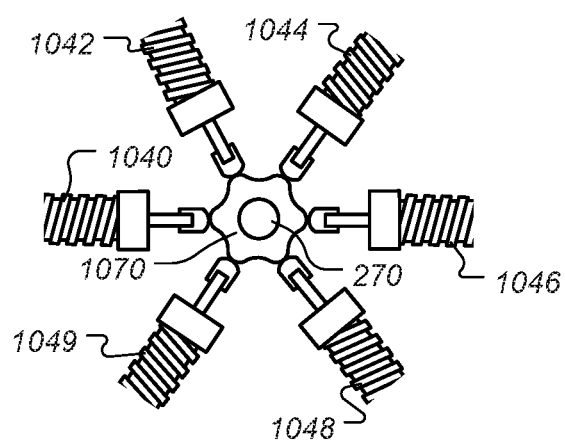

FIGS. 10A and 10B are diagrams illustrating some aspects of a gas-filled subsea electronics, according to some other embodiments. In this example, similar to the embodiments of FIGS. 9A and 9B, a rotational force is applied to central shaft 270. In this case, however, lobes on a cam piece are used to convert the rotational force to radial force. FIG. 10A shows the initial position that allows installation of the electronics into the housing, and FIG. 10B shows the final position with the heat sinks pressed against the housing wall. The rotational force in shaft 270 is converted cam piece 1070, into the springs 1040, 1042, 1044, 1046, 1048 and 1049. As in the embodiments described above, the springs push on bars that press heat sinks against housing wall (not shown). Thus, in FIGS. 10A and 10B, the springs are selectively engaged and disengaged by rotating the shaft 270.

Figure 11:
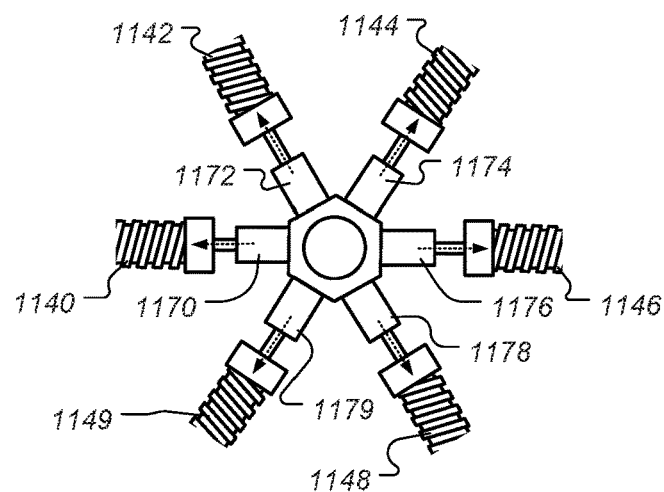
FIG. 11 is a diagram illustrating some aspects of a gas-filled subsea electronics housing, according to some other embodiments.

FIG. 11 is a diagram illustrating some aspects of a gas-filled subsea electronics housing, according to some other embodiments. In the example shown electro motors 1170, 1172, 1174, 1176, 1178 and 1179 are used to exert radial force on the springs 1140, 1142, 1144, 1146, 1148 and 1149 as shown. Thus, the springs are selectively engaged and disengaged using the electro motors 1170, 1172, 1174, 1176, 1178 and 1179.

Figure 12:
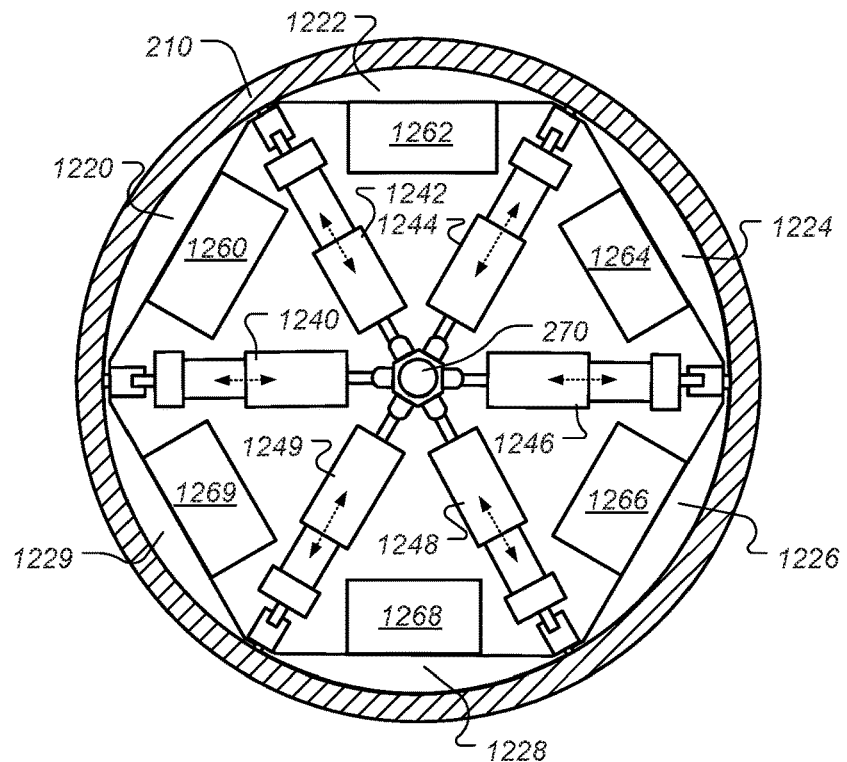
FIG. 12 is a diagram illustrating some aspects of a gas-filled subsea electronics housing, according to some other embodiments.

FIG. 12 is a diagram illustrating some aspects of a gas-filled subsea electronics housing, according to some other embodiments. In this example, hydraulic springs 1240, 1242, 1244, 1246, 1248 and 1249 are used instead of mechanical springs to provide radial force on heat sinks 1220, 1222, 1224, 1226, 1228 and 1229 to press the heat sinks against housing wall 210. The electronics modules 1260, 1262, 1264, 1266, 1268 and 1269 are shown mounted directly on the heat sinks. Thus the hydraulic springs can be selectively engaged and disengaged using a hydraulic control system (not shown). According to some embodiments, hydraulic springs such as shown in FIG. 12 can be substituted for any of the mechanical springs shown in the other embodiments described herein.

While the subject disclosure is described through the above embodiments, it will be understood by those of ordinary skill in the art that modification to and variation of the illustrated embodiments may be made without departing from the inventive concepts herein disclosed. Moreover, while some embodiments are described in connection with various illustrative structures, one skilled in the art will recognize that the system may be embodied using a variety of specific structures. Accordingly, the subject disclosure should not be viewed as limited except by the scope and spirit of the appended claims.

The invention claimed is:

1. A system, comprising:
    a housing;
    a heat sink disposed in the housing; and
    a biasing assembly comprising a plurality of biasing devices configured to selectively increase or decrease a biasing force against the heat sink toward a wall of the housing in response to movement of at least one structure driven by at least one actuator, wherein the at least one structure comprises a shaft driven by the at least one actuator to move axially and/or rotationally along a path of movement to drive movement of the plurality of biasing devices, and the plurality of biasing devices are disposed about and coupled to the shaft.

2. The system of claim 1, wherein the heat sink comprises a plurality of heat sinks disposed in the housing, and the biasing assembly is configured to selectively increase or decrease the biasing force against the plurality of heat sinks toward the wall of the housing in response to movement of the at least one structure driven by the actuator.

3. The system of claim 2, wherein the biasing assembly is configured to selectively increase or decrease the biasing force, in a radial outward direction relative to a central axis of the housing, against the plurality of heat sinks toward the wall of the housing.

4. The system of claim 1, wherein each of the plurality of biasing devices is configured to move relative to the heat sink and the shaft.

5. The system of claim 1, wherein each of the plurality of biasing devices comprises a rotating linkage having a spring.

6. The system of claim 1, wherein each of the plurality of biasing devices comprises a mechanical drive having at least one of a spring, a pivot member, a rotating linkage, a cam surface, or any combination thereof.

7. The system of claim 1, wherein the at least one actuator comprises a threaded nut coupled to the shaft.

8. The system of claim 1, wherein each of the plurality of biasing devices comprises an arm having opposite first and second end portions, the first end portion is coupled to the shaft, and the second end portion is coupled to the heat sink, wherein the second end portion is configured to move in response to movement of the shaft driven by the at least one actuator.

9. The system of claim 1, wherein the housing is a subsea housing.

10. The system of claim 9, wherein the subsea housing has a gas-filled internal volume.

11. The system of claim 1, comprising an electronic device thermally coupled to the heat sink.

12. The system of claim 11, comprising a heat pipe extending between the heat sink and the electronic device.

13. The system of claim 1, wherein the biasing assembly is configured to convert a force applied by the at least one structure in a first direction into the biasing force in a second direction different from the first direction.

14. The system of claim 1, wherein the biasing assembly comprises at least one of a pivot member, a rotating linkage, a cam, or any combination thereof, configured to selectively increase or decrease the biasing force in response to movement of the at least one structure driven by the at least one actuator.

15. The system of claim 14, wherein the biasing assembly further comprises a spring.

16. A system, comprising:
   an actuator; and
   a plurality of biasing devices coupled to the actuator, wherein each of the plurality of biasing devices is responsive to movement of at least one structure driven by the actuator to selectively increase or decrease a biasing force against one of a plurality of heat sinks, wherein the at least one structure comprises a shaft driven by the actuator to move axially and/or rotationally along a path of movement to drive movement of the plurality of biasing devices, and the plurality of biasing devices are disposed about and coupled to the shaft.

17. The system of claim 8, wherein the first end portion comprises a first pivot joint or cam interface coupled to the shaft.

18. The system of claim 17, wherein the second end portion comprises a second pivot joint coupled to the heat sink.

19. A system, comprising:
   a housing;
   a heat sink disposed in the housing;
   an electronic device thermally coupled to the heat sink;
   a heat pipe extending between the heat sink and the electronic device; and
   a biasing assembly configured to selectively increase or decrease a biasing force against the heat sink toward a wall of the housing in response to movement of at least one structure driven by at least one actuator.

* * * * *